United States Patent
Franlin

(10) Patent No.: US 7,863,886 B2
(45) Date of Patent: Jan. 4, 2011

(54) METHOD FOR DETERMINING THE RESONANT FREQUENCY(S) OF AN ENERGIZED POWER LINE CARRIER LINE (WAVE) TRAP

(75) Inventor: Gregory A. Franlin, Hayden, AL (US)

(73) Assignee: Southern Company Services, Inc., Birmingham, AL (US)

( * ) Notice: Subject to any disclaimer, the term of this patent is extended or adjusted under 35 U.S.C. 154(b) by 135 days.

(21) Appl. No.: 12/383,908

(22) Filed: Mar. 30, 2009

(65) Prior Publication Data

US 2010/0244814 A1 Sep. 30, 2010

(51) Int. Cl.
*G01R 15/18* (2006.01)

(52) U.S. Cl. ............... 324/117 R; 324/76.39; 324/126; 324/127

(58) Field of Classification Search .......... None
See application file for complete search history.

(56) References Cited

U.S. PATENT DOCUMENTS

| 5,036,285 A | * | 7/1991 | Shaw | 324/546 |
| 5,548,279 A | * | 8/1996 | Gaines | 340/664 |
| 7,405,567 B2 | * | 7/2008 | McDowell | 324/318 |

* cited by examiner

*Primary Examiner*—Vinh P Nguyen
(74) *Attorney, Agent, or Firm*—Ballard Spahr LLP

(57) ABSTRACT

A method for testing a line trap of the type whose blocking characteristics are a function of its resonant frequencies without requiring the line trap to be de-energized along with the transmission line to which the trap is connected by injecting a signal into the transmission line over a range of frequencies including at least one of the line trap's expected resonant frequencies; measuring the magnetic field strength produced by the current through the line trap's main coil and the total current flowing through the line trap, and computing the ratio of the magnetic fields where the ratio is computed over a range of frequencies that includes the expected resonant frequency(s) of the line trap, such that the resonant frequencies are indicated where said ratio is at a local maxima or minima.

7 Claims, 3 Drawing Sheets

METHOD FOR DETERMINING THE RESONANT FREQUENCY(S) OF AN ENERGIZED POWER LINE CARRIER LINE (WAVE) TRAP

BACKGROUND OF THE INVENTION

The present invention relates generally to the field of power line carrier systems and high-voltage electric power transmission line protection. Power line carrier systems are used by electric utilities in high-speed protection schemes for electrical faults occurring on high-voltage transmission lines. Line traps, which may also be known as wave traps, are an integral part of these power line carrier systems. Line traps are basically band-reject or notch filters composed of resistive, inductive, and capacitive components. As such, line traps must be tested regularly to ensure proper tuning for overall system performance. In other words, the blocking characteristics of the line trap must be measured periodically to verify that the electrical components comprising the line trap are tuned to block, or trap, the desired power line carrier signal frequency or band of frequencies used in a particular power line carrier installation.

Because a line trap is energized at the same electrical potential as the transmission line to which it is connected, heretofore it has been known that methods for directly measuring the blocking characteristics of a line trap required the line trap to be de-energized and grounded to earth potential so that test equipment could be connected to the line trap. Hence, the high-voltage transmission line to which the line trap is connected must also be de-energized and grounded to earth potential. Electric utilities can incur significant monetary and reliability expenses when they take a high-voltage transmission line out of service. A primary economic advantage gained is in time and manpower. There is significant time and manpower involved in taking a transmission line out of service to test a line trap. Additionally, reliability of the transmission system is at risk anytime a major power flow corridor (a high-voltage transmission line) is out of service. If another transmission line were to be unexpectedly taken out of service by some abnormal system condition, overall system stability can be jeopardized. Furthermore, there is the risk of human error or equipment malfunction during the process of taking a line out of service that could result in significant loss of load, which equates to lost revenue for an electric utility. Therefore, a method for determining the blocking characteristics of a line trap without de-energizing the line trap would be highly beneficial to the electric utility industry for both economic and reliability reasons.

BRIEF SUMMARY OF THE INVENTION

Presently in the electric utility industry, methods for determining the blocking characteristics of a power line carrier line trap require the line trap, and correspondingly the transmission line to which the line trap is connected, to be de-energized and grounded to earth potential so that test devices can be physically connected to the line trap. A typical test would involve applying a variable frequency voltage source directly to the line trap and measuring the impedance of the line trap at various frequencies over a range of frequencies that includes the expected blocking frequency(s) of the line trap, where the blocking frequency(s) corresponds to increased impedance presented by the line trap circuitry. An alternative industry test method consists of placing a constant (frequency-independent) resistance in series with the line trap under test. A variable frequency voltage source is then applied to the series combination of the resistor and line trap over a range of frequencies that includes the expected blocking frequency(s) of the line trap. The blocking characteristics of the line trap can then be discerned by computing the ratio of the voltage across line trap to the voltage across the resistor. This test method provides the same information as the previously described test method in that the ratio of the voltages across the resistor and line trap will change with frequency because the impedance of the line trap changes with frequency. That is, as the impedance of the line trap increases, the aforementioned ratio also increases, thereby making the blocking characteristics of the line trap dissemble. Both of the previously described methods for testing a line trap have long been in use in the electric utility industry; however, they both have one common disadvantage, which is that both methods require the line trap to be de-energized along with the transmission line to which the trap is connected. It is the principal object of the invention disclosed herein to provide a new method for determining the blocking characteristics of a power line carrier line trap of the type whose frequency blocking characteristics are a function of its resonant frequency(s). The main advantage of this new method is that the method does not require the line trap or the transmission line to which it is connected to be de-energized.

The achievement of these objects is predicated on the recognition that the resonant frequency(s) of a line trap of the type whose blocking characteristics are a function of its resonant frequency(s) is the only information needed to determine if said line trap exists in a desired state of tune. It will be observed in the present invention that the resonant frequency(s) can be discerned by computing the ratio of the electric current through the line trap's main coil to the total electric current through the entire line trap circuit. Or, since the strength of a magnetic field is directly proportional to the electric current producing said magnetic field, the resonant frequency(s) of a line trap can be determined by computing the ratio of the strength of the magnetic field produced by electric current flowing through a line trap's main coil (inductor) to the strength of the magnetic field produced by electric current entering or exiting the entire line trap circuit, where the aforementioned ratio is computed over a range of frequencies that includes the expected resonant frequency(s) of the line trap.

BRIEF DESCRIPTION OF THE DRAWINGS

Apparatus embodying features of my invention are depicted in the accompanying drawings which form a portion of this disclosure and wherein.

DETAILED DESCRIPTION OF THE INVENTION

Figure 1:
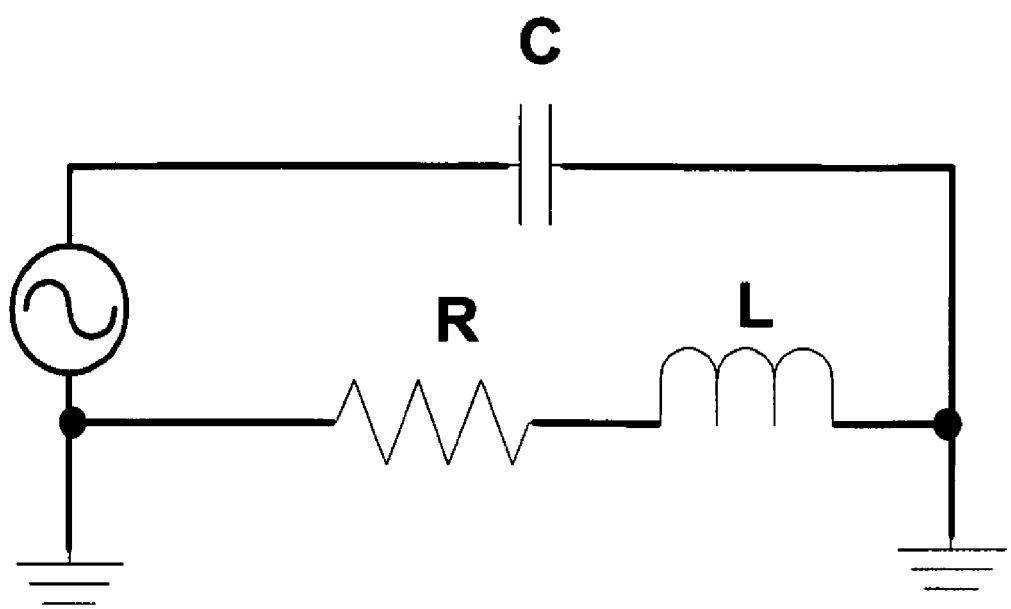
FIG. 1 is a schematic of a parallel LC circuit used for digital computer simulations.

Referring to the drawings, it will become apparent that a new and improved method for determining the resonant frequency(s) of a power line carrier line trap whose blocking characteristics are a function of its resonant frequency(s) is herein disclosed. For the aforementioned types of line traps, the resonant frequency(s) is the criterion that specifies whether or not a trap is tuned properly. The act of tuning a trap is that of adjusting the trap's circuit components so that the line trap circuit exhibits some specified resonant frequency(s). Therefore, for line traps whose blocking characteristics are a function of its resonant frequency(s), knowledge of the resonant frequency(s) of the line trap is all that is required to discern whether or not the line trap exists in an acceptable state of tune. The method developed and disclosed herein is based on the behavior of parallel resonant inductive and capacitive (LC) circuits, which is the principle type of circuit comprising line traps whose blocking characteristics are a function of their resonant frequency(s).

In a parallel resonant LC circuit, the overall impedance of the circuit reaches a maximum at the resonant frequency, so current flow through the entire circuit reaches a minimum. However, at resonance, electric current still circulates in the tank circuit formed by the parallel combination of the inductor and capacitor. Thus, the resonant frequency(s) of a line trap whose blocking characteristics are a function of its resonant frequency(s) can be determined by computing the ratio of the electric current through the main coil to the total electric current through the entire line trap circuit. As an example, FIG. 1 shows the equivalent circuit of a parallel LC circuit whose resonant frequency is given by (1).

$$f_{res} = \frac{1}{2\pi\sqrt{LC}} \quad (1)$$

$$= \frac{1}{2\pi\sqrt{(265*10^{-6})(2.39*10^{-9})}}$$

$$= 200 \text{ kHz}$$

Figure 2:
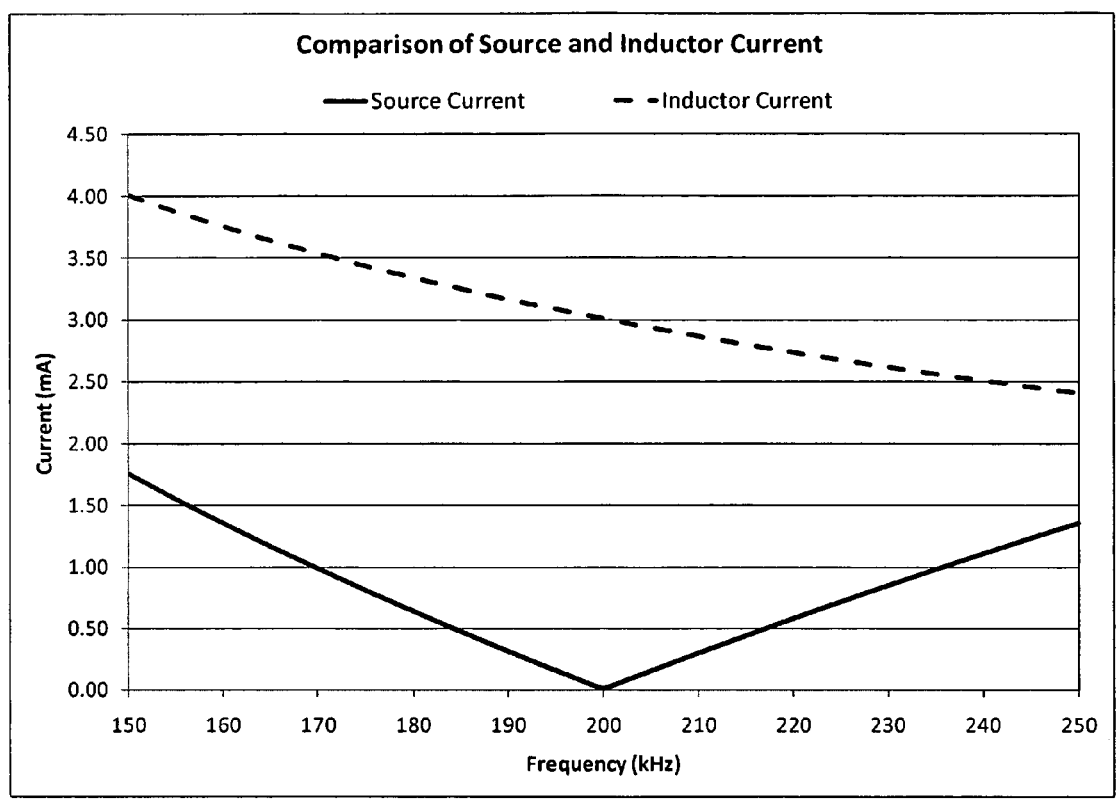
FIG. 2 is a graphical depiction showing the results of a digital computer simulation of the electric current through the inductor of a parallel LC circuit and the total current through the parallel LC circuit versus frequency.
Figure 3:
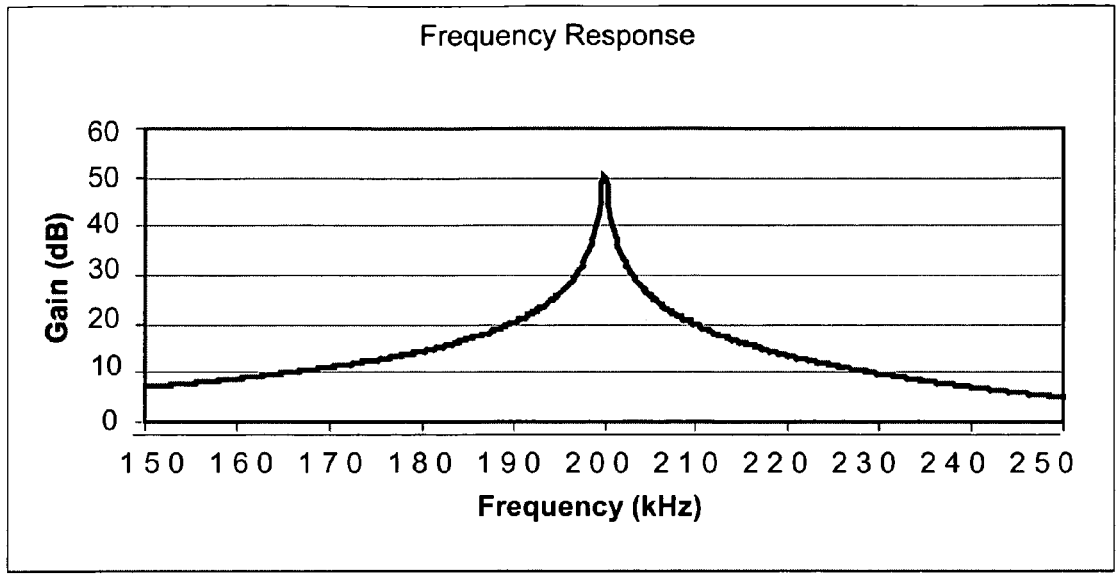
FIG. 3 is a graphical depiction showing the ratio, in decibels, of electric current through the inductor of a parallel LC circuit to the total current through the parallel LC circuit.

FIG. 2 shows a digital computer simulation of the circuit of FIG. 1 whereby the current through the aforementioned circuit's inductor, which represents the main coil of a line trap, and the total current through the circuit versus frequency were computed. FIG. 3 shows the ratio, in decibels, of the inductor current and the total current for the circuit of FIG. 1. As shown in FIG. 3, there is a distinct maximum at the resonant frequency of 200 kHz. When the ratio of the electric current through the main coil to the total electric current through the entire line trap circuit is computed over a range of frequencies that includes a line trap's resonant frequency(s), the resonant frequency(s) will become discernable if the line trap is indeed resonant within the aforementioned range of frequencies. Specifically, a graph of the aforementioned ratio will yield local maxima or minima, depending on the particular type of line trap, at the resonant frequency(s).

Figure 4:
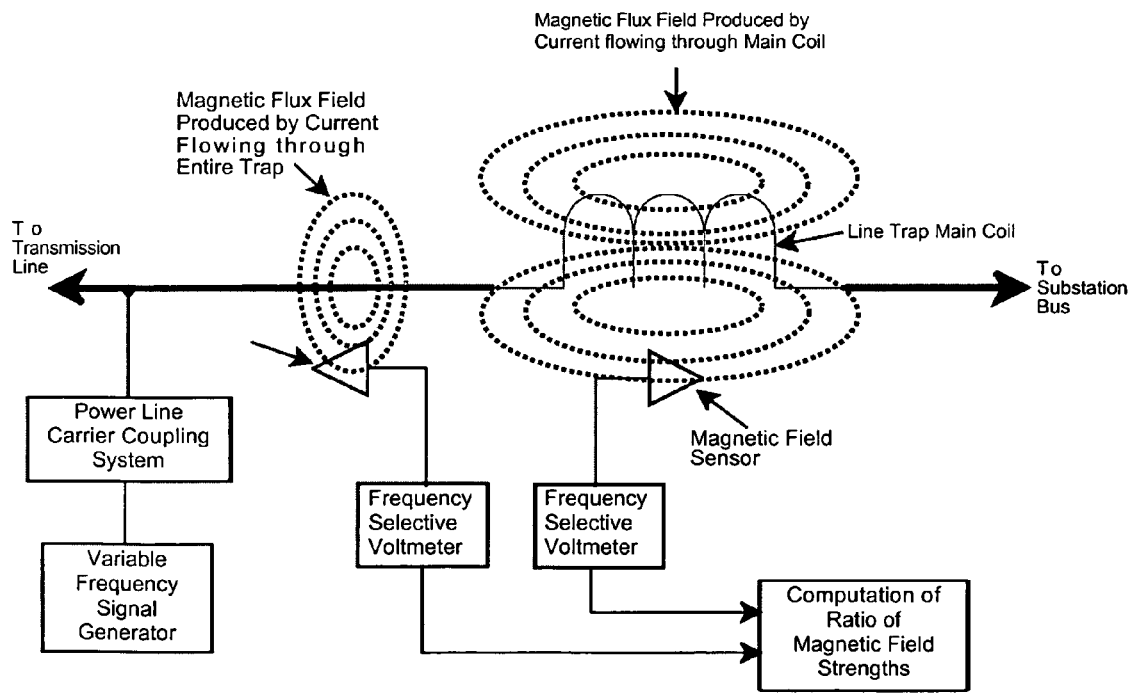
FIG. 4 is a graphical depiction showing a physical implementation of the new method, described herein, for determining the resonant frequency(s) of a line trap.

Furthermore, since magnetic field strength is directly proportional to the electric current producing the magnetic field, the resonant frequency(s) of a line trap can also be determined by computing the ratio of the strength of the magnetic field produced by the electric current flowing through a line trap's main coil to the strength of the magnetic field produced by the electric current entering or exiting the entire line trap circuit. It is this method of computing the ratio of the strength of the magnetic field produced by the electric current flowing through a line trap's main coil to the strength of the magnetic field produced by the electric current entering or exiting the entire line trap circuit that is the preferred method because the magnetic fields can be measured without physical contact with the energized line trap or transmission line. A diagram of one possible physical implementation of this method is shown in FIG. 4. The method consists of injecting a signal over a range of frequencies, where the range of frequencies includes the line trap's expected resonant frequency(s), and simultaneously measuring the magnetic field strength produced by current through the line trap's main coil and the magnetic field strength produced by the total current entering or exiting the line trap. The method can be implemented by coupling a variable frequency source to a transmission line through a power line carrier coupling system as shown in FIG. 4, where the power line coupling system used is one capable of coupling the desired range of frequencies. An industry standard coupling system can be used for this purpose. The strength of the magnetic fields can then be measured at each frequency in the desired range of frequencies using magnetic field sensors appropriate for the frequency range of interest. For the possible implementation shown in FIG. 4, the magnetic field sensors are assumed to produce voltage outputs that are linearly proportional to the strength of the magnetic fields being sensed and it is assumed that the voltage outputs of the sensors contain the frequency component corresponding to the frequency of the current that is producing the magnetic fields being sensed. For a sensor with the aforementioned type of output, a frequency selective voltmeter, as shown in FIG. 4, is preferred for measuring the output produced by the magnetic field sensors. A frequency selective voltmeter is preferred so that the measurements of the magnetic fields produced by the test current from the signal generator can be isolated, thus minimizing extraneous signals from possibly interfering with the measurements. The ratio of the strength of the magnetic fields can then be computed at each frequency in the desired range of frequencies to determine the trap's resonant frequency(s), where the magnetic field strengths are represented by voltages from the magnetic field sensors.

The general steps to applying the new test method are as follows:

1. Make connections for variable frequency signal generator, frequency selective voltmeters, and magnetic field sensors, as shown in FIG. 4.
2. Apply a first frequency in frequency band of interest using the signal generator.
3. Record readings from each frequency selective voltmeter, where each frequency selective voltmeter is set for the frequency that is being applied by the signal generator.
4. Compute the gain in decibels of the ratio of the voltage produced by the magnetic field sensor for the line trap's main coil to the voltage produced by the magnetic field sensor for the total current through the line trap.
5. Repeat steps 2-4 for each frequency in the band of interest.
6. Plot the results of the gain computations versus frequency to discern the resonant points in the response.

Examples of apparatus that may be used for implementing the new test method are as follows:

1. The signal generator and frequency selective voltmeters can be obtained via a QuanteQ PSM 2200 Integrated Test Instrument that contains a variable frequency signal generator and dual channel frequency selective voltmeter.
2. The magnetic field sensors that produce a voltage output that is proportional to magnetic field strength can be obtained via simple wire-wound coils. An example of such a coil for use with the test method could have a frame with dimensions of 1-foot by 1-foot by 1-inch. The wire size for the coil could be 26 AWG, and the number of turns for the coil could be ten. The aforementioned coil design would yield a coil with a self-resonant frequency of greater than 400 kHz. The coil design should have a self-resonant frequency that exceeds the frequency band of interest for the line trap being tested.

As stated previously, the aforementioned implementation of my new test method is only one possible implementation. There are numerous variations of implementing my new test method that will be obvious to those skilled in the art, and is thus susceptible to modification without departing from the spirit thereof.

What is claimed is:

1. A method for determining the resonant frequencies of a power transmission line carrier line trap of the type whose blocking characteristics are a function of its resonant frequencies comprising:
   a) injecting a signal into the transmission line over a range of frequencies, where the range of frequencies includes at least one of the line trap's expected resonant frequencies;
   b) measuring the magnetic field strength produced by the current through the line trap's main coil;
   c) measuring the magnetic field strength produced by the total current flowing through the line trap;
   d) computing the ratio of the strength of the magnetic field produced by electric current flowing through the line trap's main coil to the strength of the magnetic field produced by electric current through the entire line trap, where said ratio is computed over a range of frequencies that includes the expected resonant frequency(s) of the line trap, such that the resonant frequencies are indicated where said ratio is at a local maxima or minima.

2. The method of claim 1 wherein said step of injecting a signal comprises coupling a variable frequency source to the transmission line through a power line carrier coupling system.

3. The method of claim 1 wherein the steps of measuring the magnetic field strength comprise using magnetic field sensors for the frequency range of interest.

4. The method of claim 3 wherein the magnetic field sensors produce voltage outputs that are linearly proportional to the strength of the magnetic fields being sensed.

5. The method of claim 4 further comprising measuring the voltage outputs of the magnetic field sensors with a frequency selective voltmeter.

6. An apparatus for determining the resonant frequencies of a power transmission line carrier line trap of the type whose blocking characteristics are a function of its resonant frequencies comprising:
   a) a signal generator for injecting a signal into the transmission line over a range of frequencies;
   b) magnetic field sensors for measuring the magnetic field strength produced by the current through the line trap's main coil and the magnetic field strength produced by the total current flowing through the line trap;
   c) a frequency selective voltmeter for measuring the voltage outputs of the magnetic field sensors.

7. The apparatus of claim 6 where the magnetic field sensors produce voltage outputs that are linearly proportional to the strength of the magnetic fields being sensed.

* * * * *

UNITED STATES PATENT AND TRADEMARK OFFICE
CERTIFICATE OF CORRECTION

PATENT NO. : 7,863,886 B2  
APPLICATION NO. : 12/383908  
DATED : January 4, 2011  
INVENTOR(S) : Gregory A. Franklin Page 1 of 1

It is certified that error appears in the above-identified patent and that said Letters Patent is hereby corrected as shown below:

Item (75) Inventor, please change the misspelled name of the inventor from "Gregory A. Franlin, Hayden, AL (US)"

to read

--Gregory A. Franklin, Hayden, AL (US)--

Signed and Sealed this
Twenty-ninth Day of March, 2011

David J. Kappos
*Director of the United States Patent and Trademark Office*